(12) United States Patent
Udrea et al.

(10) Patent No.: US 8,564,097 B2
(45) Date of Patent: Oct. 22, 2013

(54) REVERSE CONDUCTING IGBT

(75) Inventors: Florin Udrea, Cambridge (GB); Chih-Wei Hsu, Taipei (TW); Wei-Chieh Lin, Hsin-Chu (TW)

(73) Assignee: Sinopower Semiconductor, Inc., Hsin-Chu (TW)

(*) Notice: Subject to any disclaimer, the term of this patent is extended or adjusted under 35 U.S.C. 154(b) by 479 days.

(21) Appl. No.: 12/760,754

(22) Filed: Apr. 15, 2010

(65) Prior Publication Data

US 2011/0254050 A1 Oct. 20, 2011

(51) Int. Cl.
  *H01L 27/082* (2006.01)
(52) U.S. Cl.
  USPC .................................. 257/570; 257/E29.22
(58) Field of Classification Search
  USPC ............................... 257/570, E29.22
  See application file for complete search history.

(56) References Cited

U.S. PATENT DOCUMENTS

| | | | |
|---|---|---|---|
| 5,260,984 | A | 11/1993 | Horbaschek |
| 5,702,961 | A | 12/1997 | Park |
| 7,112,868 | B2 | 9/2006 | Willmeroth et al. |
| 7,154,145 | B2 | 12/2006 | Takahashi |
| 2003/0042575 | A1* | 3/2003 | Takahashi et al. ............ 257/577 |

* cited by examiner

*Primary Examiner* — Benjamin Sandvik
*Assistant Examiner* — Leslie Pilar Cruz
(74) *Attorney, Agent, or Firm* — Renner, Otto, Boisselle & Sklar, LLP

(57) ABSTRACT

An insulated gate bipolar transistor (IGBT) is provided comprising a semiconductor substrate having the following regions in sequence: (i) a first region of a first conductive type having opposing surfaces, a column region of a second conductive type within the first region extending from a first of said opposing surfaces; (ii) a drift region of the second conductive type; (iii) a second region of the first conductive type, and (iv) a third region of the second conductive type. There is provided a gate electrode disposed to form a channel between the third region and the drift region, a first electrode operatively connected to the second region and the third region, a second electrode operatively connected to the first region and the column region. The arrangement of the IGBT is such that the column region is spaced from a second surface of the opposing surfaces of the first region, whereby a forward conduction path extends sequentially through the third region, the second region, the drift region, and the first region, and whereby a reverse conduction path extends sequentially through the second region, the drift region, the first region and the column region. Reverse conduction of the IGBT occurs through a thyristor structure which is embedded in the IGBT. Such an IGBT structure is advantageous over a reverse conducting IGBT structure in which an anti-parallel diode is integrated or embedded because it provides improved reverse conduction and snapback performance.

18 Claims, 11 Drawing Sheets

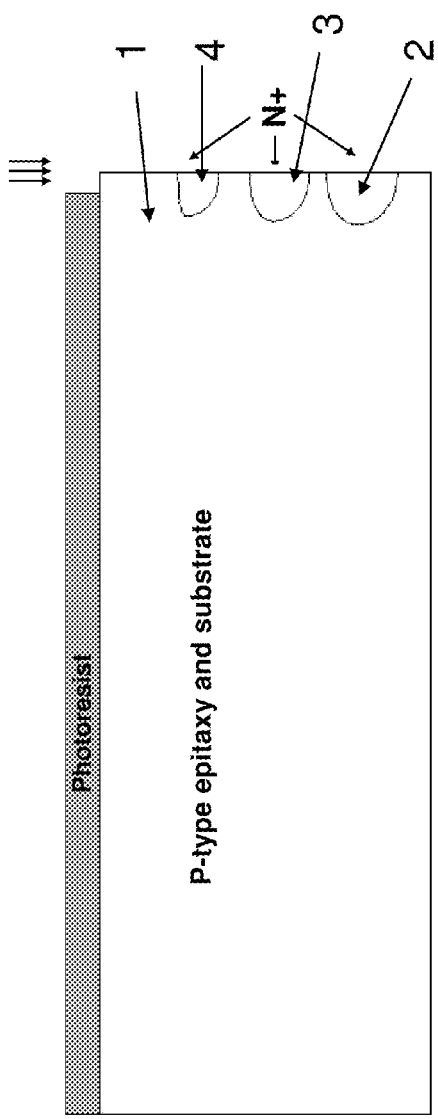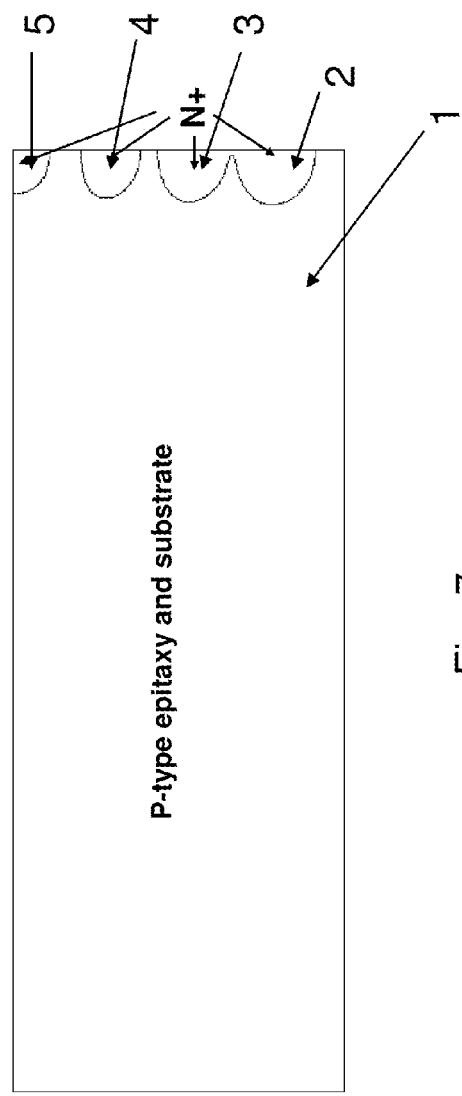

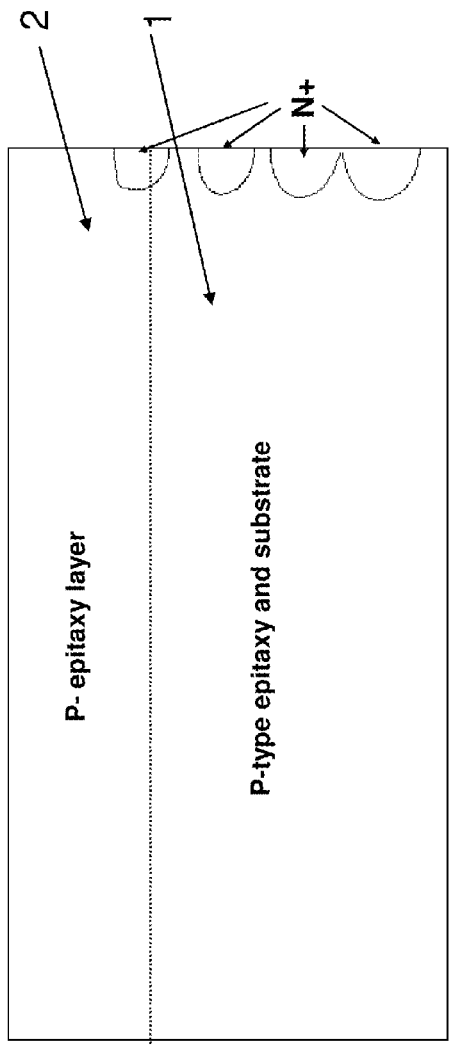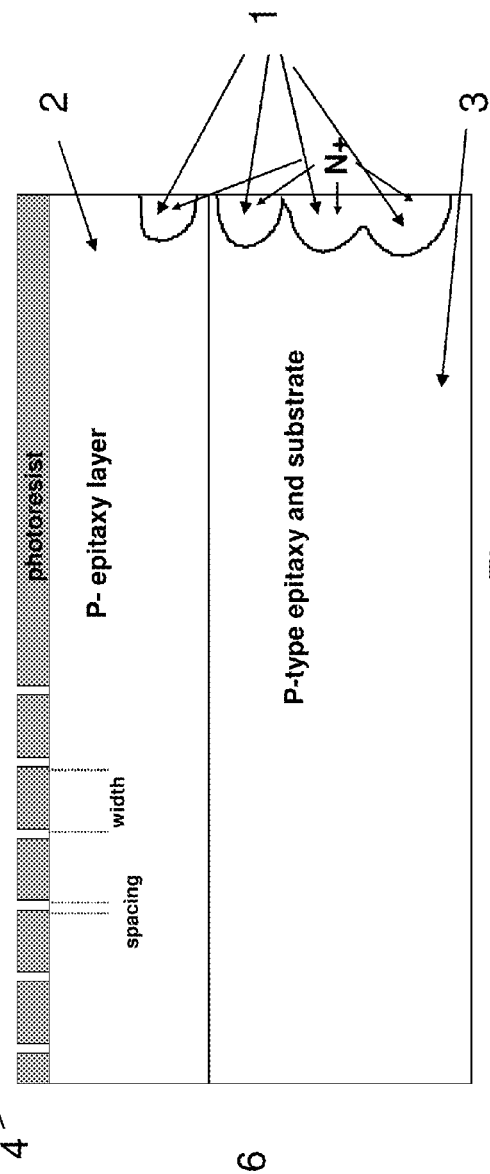

REVERSE CONDUCTING IGBT

FIELD OF INVENTION

The present invention relates to a reverse conducting bipolar transistor, and particularly to a reverse conducting insulated gate bipolar transistor (RC-IGBT) for use in power electronics applications.

BACKGROUND TO THE INVENTION

As a uni-directional conducting device, the insulated gate bipolar transistor (IGBT) requires an anti-parallel diode to release the energy stored in the inductive load in a transient turn-off state. Conventionally the anti-parallel diode is externally co-packed with the IGBT. This results in additional BOM (Bill of Material), additional testing time, and increased cost for the separate devices, and associated cost for the package. Moreover the approach of co-packing the IGBT and diode in one package increases the probable yield loss of the module, as failure of any of these devices results in malfunction of the whole part.

Recently the development of reverse-conducting IGBTs (RC-IGBTs), i.e. the combination of the IGBT and the diode in a monolithic chip, has attracted much attention [see e.g. H. Takahashi, A. Yamamoto, S. Aono, T. Minato, T, "1200V reverse conducting IGBT", ISPSD 2004, pp. 133-136; H. Ruthing, F. Hille, F. J. Niedernostheide, H. J. Schulze, B. Brunner, B, "600 V Reverse Conducting (RC-)IGBT for Drives Applications in Ultra-Thin Wafer Technology", ISPSD 2007, pp. 89-92; D. Kumar, M. Sweet, K. Vershinin, L. Ngwendson, E. M. S. Narayanan, "RC-TCIGBT: A Reverse Conducting Trench Clustered IGBT", ISPSD 2007, pp. 161-164; T. Kimmer, J. Oehmen, P. Türkes, S. Voss, "Reverse Conducting IGBT—A new Technology to Increase the Energy Efficiency of Induction Cookers", PESC 2008, pp. 2284-2287]. A conventional way to realise a RC-IGBT is to have a $N^+$ region embedded in an anode/collector region of the IGBT. The $N^+$ region is shorted by an anode/collector terminal to a $P^+$ anode injector and is also in contact with a N-buffer region or a N-drift region in case of a non-punch-through (NPT) IGBT. This short allows the formation of an anti-parallel diode, which enables current conduction in the IGBT in a reverse mode (current flows from a cathode/emitter terminal to the anode/collector terminal).

Some known RC-IGBT structures are described in the following.

U.S. Pat. No. 5,260,984 discloses a reverse conducting IGBT in which the IGBT and the diode are co-packed in a package. This leads to insulation, chip displacement and wiring issues for the package. In addition, this also results in a parasitic inductance which restrains the switching speed of the IGBT. This document proposes to separate the IGBT and the diode in two portions but in one single chip, with an intermediate non-interference region being provided to avoid latch-up. Conventional anode shorts have been adapted in the IGBT portion for reducing the quantity of minority carriers in the drift region.

U.S. Pat. No. 5,702,961 relates to a reverse conducting IGBT in which the diode is formed between the IGBTs so as to save cost on area. Furthermore, the diode and the IGBT share the same top metal so that there is no need for wiring the anode of the diode and the emitter of the IGBT. The design of the $N^+$ region of the diode is conventional in which the $N^+$ region is in contact with the $N^+$ buffer region.

U.S. Pat. No. 7,112,868 concerns a reverse conducting IGBT which is particularly used where the required current-carrying capacity of the diode is less than that of the IGBT. In the disclosed structure, the $N^+$ region is placed at the high-voltage edge (i.e. termination) using the conventional approach.

U.S. Pat. No. 7,154,145 discloses a reverse conducting IGBT which reduces reverse recovery current and turn-off time of the anti-parallel diode. The document proposes to create P-type side diffusion regions beside the trenches. In the disclosed structure, the area of P-type region is enlarged so that the hole injection efficiency, when the diode turns on, is enhanced. The reverse conducting structure of the disclosed device relies on the conventional approach, i.e. a backside $N^+$ region directly contacting the N-drift region of the IGBT.

Conventional RC-IGBT structures have however several drawbacks. The first is that there is an undesirable snapback characteristic realised when the IGBT is in a forward mode. This snapback characteristic has a negative resistance associated with it which produces harmonics and can lead to undesirable ringing and oscillations in the system. It has been demonstrated that, by reducing the area density of the $N^+$ regions compared to the $P^+$ anode region, it is possible to reduce the snapback characteristic but at the expense of a poorer performance of the anti-parallel diode in the reverse mode (that is the conduction through the IGBT).

Thus there is a need for an efficient RC-IGBT design to address the trade-off between the IGBT performance in the forward mode and in the reverse mode.

It is an object of the present invention to provide a simple and cost effective RC-IGBT design which at least mitigates the above trade-off.

STATEMENT OF THE INVENTION

According to one aspect of the present invention there is provided an insulated gate bipolar transistor (IGBT) comprising a semiconductor substrate having the following regions in sequence:
(i) a first region of a first conductive type having opposing surfaces, a column region of a second conductive type within the first region extending from a first of said opposing surfaces;
(ii) a drift region of the second conductive type;
(iii) a second region of the first conductive type; and
(iv) a third region of the second conductive type;
wherein a gate electrode is disposed to form a current channel between the third region and the drift region, a first electrode is operatively connected to the second region and the third region, and a second electrode is operatively connected to the first region and the column region, and
wherein the column region is spaced from a second of said opposing surfaces, whereby a forward conduction path extends through the third region, the second region, the drift region, and the first region, and whereby a reverse conduction path extends through the second region, the drift region, the first region and the column region.

Preferably the column region is also spaced from the drift region. The first region may comprise first and second layers, the second layer having a lower doping concentration than the first layer. The height of the first layer of the first region may be substantially the same as that of the column region. Conveniently reverse conduction occurs through an anti-parallel thyristor structure comprising a first bipolar junction transistor (BJT) formed by the second layer of the first region, the drift region, the second region, and a second bipolar junction transistor (BJT) formed by the column region, the second layer of the first region and the drift region. Preferably the first conductive type is the p-conductivity type and the second conductive type is the n-conductivity type.

The invention provides an IGBT with an anti-parallel reverse conducting thyristor structure. This is different from all state-of-the-art RC-IGBTs which are based on the anti-parallel diode. The thyristor performance, in an on-state conduction mode, is similar to that of the anti-parallel diode (reverse conducting diode). This is because the plasma (excess carrier concentration) in a thyristor is similar to that in a PIN diode in the on-state mode. As mentioned, the thyristor comprises two bipolar transistors, a NPN and a PNP in a positive feedback configuration, with the base and collector terminals of the transistors connected to each other.

In one embodiment, the thyristor is formed by the second region (P-base which is the emitter of the PNP transistor), N-drift region and optional N-buffer region (acting together as the base of the PNP transistor and at the same time the collector of the NPN transistor), the second layer of the first region (P⁻ layer acting as the collector of PNP transistor and at the same time the base of the NPN transistor) and the column region (N⁺ region acting as the emitter of the NPN transistor) connected to the anode terminal. Unlike the state-of-the-art anti-parallel diode (which is in the on-state mode once a 0.7 V is applied to its anode), the anti-parallel thyristor structure is not immediately triggered. Typically triggering of the thyristor is complex and occurs when (i) the total current gain of the NPN transistor ($\alpha_{NPN}$) and the PNP transistor ($\alpha_{PNP}$) is 1 or (ii) when either the drift region (n-base) or the second layer of the first region (p-base) is depleted and one of the transistors is in a punch-through mode or (iii) when avalanche occurs. In the present invention, the first two mechanisms for triggering the thyristor in its on-state (in the anti-parallel conduction of the IGBT) have been used.

Reverse conduction in the off-state has been improved by reducing the space between the column region and the second surface of the first region, by lowering the doping concentration of the second layer of the first region and by dimensioning the column region so as to increase the density of the column region. In order to address the snapback issue in the on-state, there are provided multiple gate structures with only one N⁺ column region. This results in an improved channel density which eliminates the snapback characteristic.

According to another aspect of the invention, there is provided a method of manufacturing an insulated gate bipolar transistor comprising a semiconductor substrate having the following regions in sequence:

(i) a first region of a first conductive type having opposing surfaces, a column region of a second conductive type within the first region extending from a first of said opposing surfaces;
(ii) a drift region of the second conductive type;
(iii) a second region of the first conductive type; and
(iv) a third region of the second conductive type;
wherein a gate electrode is disposed to form a current channel between the third region and the drift region, a first electrode is operatively connected to the second region and the third region, and a second electrode is operatively connected to the first region and the column region, the method comprising:
spacing the column region from a second of said opposing surfaces, whereby a forward conduction path extends through the third region, the second region, the drift region and the first region, and whereby a reverse conduction path extends through the second region, the drift region, the first region and the column region.

BRIEF DESCRIPTION OF THE DRAWINGS

In order that the invention may be more fully understood, a number of embodiments of the invention will now be described, by way of example, with reference to the accompanying drawings, in which:

FIGS. 7a to 7h show the manufacturing steps of the RC-IGBT according to the present invention.

DETAILED DESCRIPTION OF THE PREFERRED EMBODIMENTS

Figure 1:
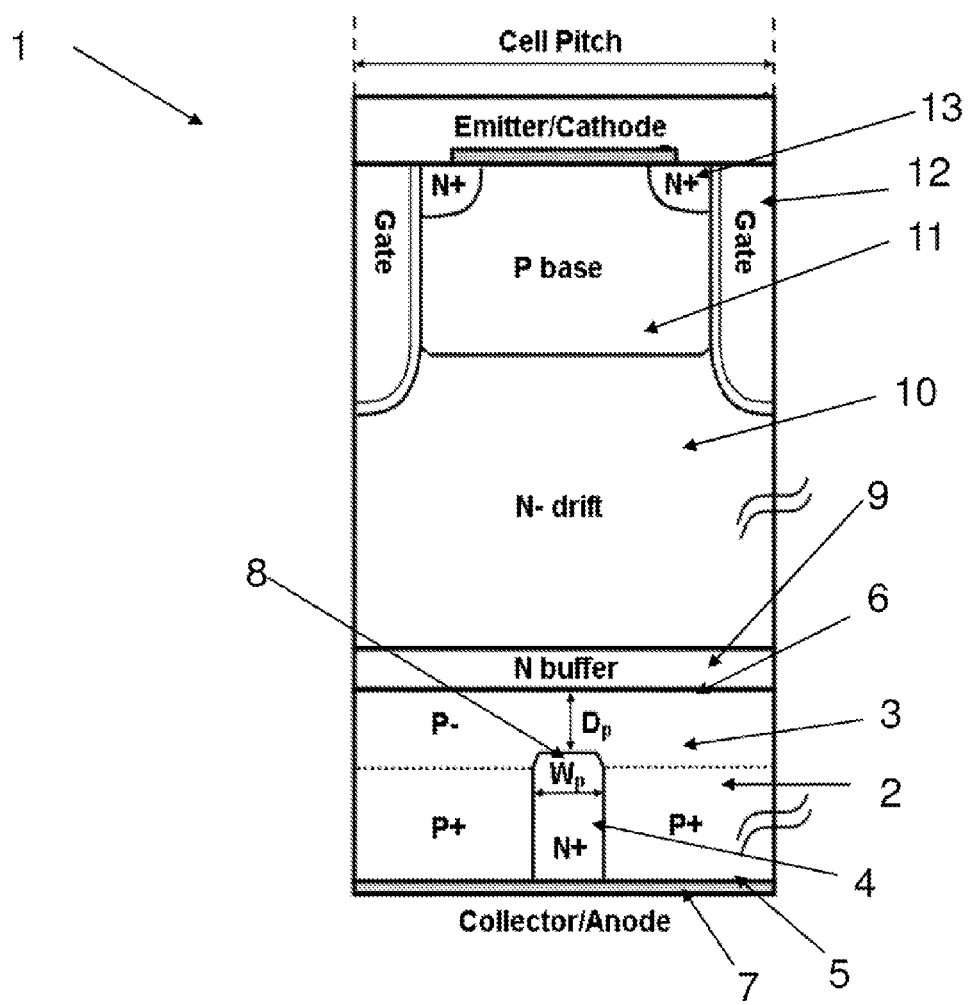
FIG. 1 is a schematic cross-section of a punch-through (PT) RC-IGBT structure according to the present invention.

FIG. 1 is a schematic representation of a RC-IGBT structure according to the present invention. The transistor 1 is formed on a P-type substrate 2 which has a first surface 5 and a second surface 6 opposite to the first surface 5. A N⁺ column region 4 is formed on the first surface 5 which is along an anode/collector electrode 7. In addition, the P-type substrate is divided into two layers: the bottom layer is a highly-doped P⁺ layer 2, and the top layer is a lowly-doped P⁻ layer 3. The interface between the P⁻ layer 3 and the P⁺ layer 2 has a height which is about the same as the height of the N⁺ column region 4. There is provided a N-buffer region 9 above the P⁻ layer 3, which is only present in a punch-through (PT) IGBT or a soft-punch-through IGBT. A N-drift region 10 is formed on the N-buffer region 9. There is also provided a P-base region 11 on the N-drift region 10 and a N⁺ region 13 on the P-base region 11. A gate region 12 is disposed to form a channel between the N⁺ region 13 and the N-drift region 10 through the P-base region 11. In this embodiment, the gate region 12 is formed by the steps of a trench gate process. It will be appreciated that the gate region 12 can also be formed by the steps of a planar gate process known as a DMOS gate process. An anti-parallel thyristor structure is formed by a PNP transistor comprising the P-base 11, N-drift region 10, N-buffer region 9 and the P⁻ layer 3; and a NPN transistor comprising the N⁺ column region 4, P layer 3, N-buffer region 9, and N-drift region 10.

The distance between the second surface 6 and a top surface 8 of the N⁺ column region 4 is referred to as $D_P$ which is important in adjusting the performance of the IGBT and the anti-parallel thyristor. Good reverse conduction performance of the IGBT has been achieved in the thyristor structure when the distance $D_P$ is kept small. The distance $D_P$ may be for example between 0.2 μm and 10 μm, preferably between 0.3 μm and 5 μm, more preferably between 0.4 μm and 1 μm.

Good reverse conduction performance has been achieved when the distance Dp is about 0.5 µm.

FIG. 1 shows that the N⁺ column region 4 is in the middle of the P⁺ substrate layer 2. It will be appreciated that the N⁺ column region 4 does not have a strict position requirement in the present invention, i.e. it may not be necessary for the N⁺ column region 4 to be aligned with any structural elements above to the N⁺ column region 4. The density of the column region 4 within the total active area of the IGBT is however a critical parameter to control the trade-off between the IGBT performance in the forward mode and its performance in the reverse mode (i.e. when the thyristor is triggered). For example, a higher density of column region 4 allows a better reverse conduction performance (as the thyristor performance becomes stronger), at the expense of a worse forward conduction performance. It will be shown that N⁺ islands are formed on the P⁻ layer 3 and the placement of the islands also plays a role in optimizing the above mentioned trade-off.

In FIG. 1, with the additional N⁺ column region 4, and the P⁻ layer 3 above it, the RC-IGBT has an intricate combination of resistors, MOSFET, PNP and NPN transistors. The MOSFET comprises N⁺ region 13, gate region 12, P-base region 11 and N-drift region 10. In the forward conduction mode of the IGBT, a gate voltage is applied to the gate region 12, which is higher than the threshold voltage of the MOSFET, $V_{Th}$, to turn on the IGBT. Then the electron current starts flowing through the inversion channel into the N-drift region 10 and becomes the supply base current for the PNP transistor formed between the P⁺ layer 2 (acting as the emitter), the N-drift region 10 (acting as the base) and the P-base region 11 (acting as the collector). The device however cannot conduct large currents until the voltage applied at the collector/anode electrode 7 is large enough (e.g. 0.7 V) to turn on the P/N junction (i.e. the emitter-base junction of the PNP transistor). Holes start injecting from the P⁺ layer 2 (emitter of the above mentioned PNP transistor) into the N-drift region 10 and the conductivity modulation effect takes place, making the excess charge concentration in the N-drift region 10 considerably higher than the background doping level. This results in reduced resistivity of the drift region 10. The excess charge is often referred to as plasma and consists of mobile carriers, with virtually equal levels of electrons and holes (this is known as the quasi-neutrality condition). The electron and holes levels are often two to three orders of magnitude higher than the doping level of the N-drift region 10.

Figure 2A:
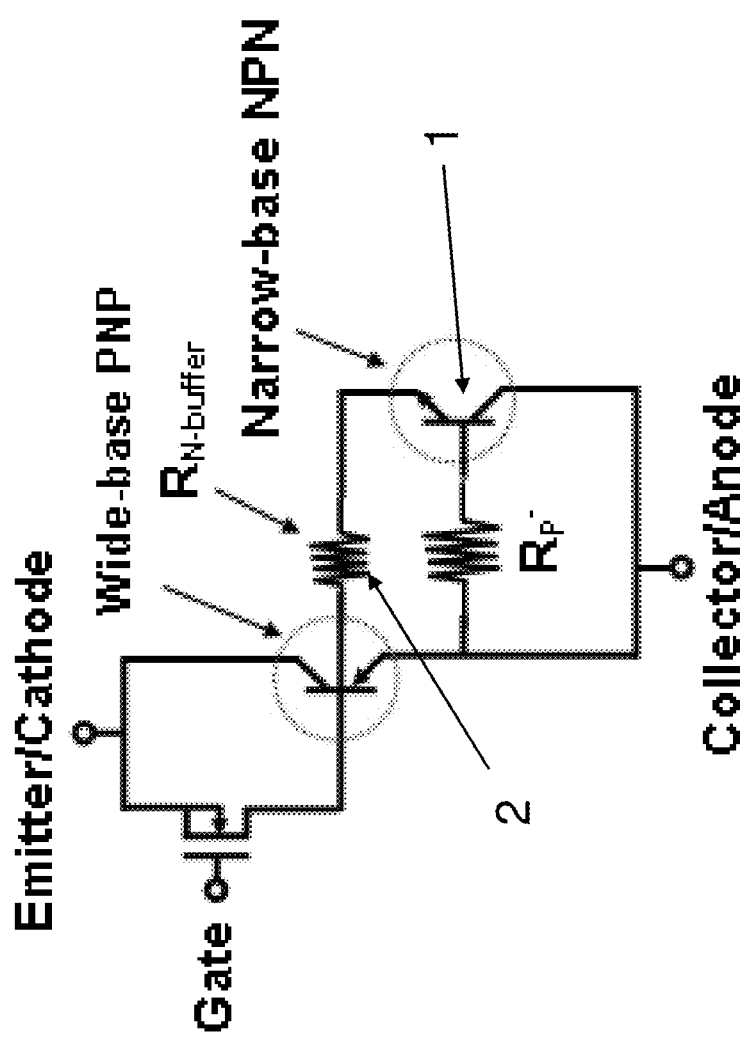
FIG. 2a is a schematic representation of an equivalent circuit for the forward conduction mode of the RC-IGBT shown in FIG. 1.

FIG. 2a is a schematic representation of an equivalent circuit for the forward conduction mode of the RC-IGBT 1 shown in FIG. 1. By contrast with conventional RC-IGBTs, the proposed device has a narrow-base NPN transistor 1 which is formed by the N-buffer 9, the P⁻ layer 3 and the N⁺ column region 4 shown in FIG. 1. If the P⁻ layer 3 is too thin, i.e. $D_P$ is too small or literally zero (as shown in the prior art), then the current gain, $\alpha_{NPN}$, will be very large and the electrons will no longer stay in the N-buffer layer 9. This situation leads to a snapback problem because the N-buffer 9 and P⁺ layer 2 are literally in contact, which makes the junction, between the P⁺ layer 2 and the N-buffer region 9, hard to turn on. Because of the existence of the narrow-base NPN BJT 1 (FIG. 2a), the RC-IGBT of the present invention can significantly minimise the snapback problem by adjusting channel density, $R_{N-buffer}$ 2 and the current gain of the narrow-base NPN BJT 1.

Figure 2B:
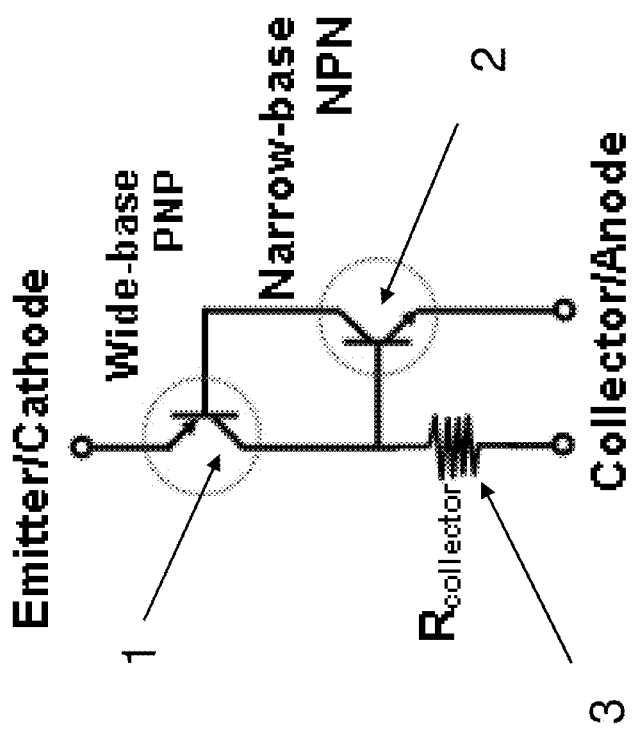
FIG. 2b is a schematic representation of an equivalent circuit for the reverse conduction mode of the RC-IGBT 1 shown in FIG. 1.

FIG. 2b is a schematic representation of an equivalent circuit for the reverse conduction mode of the RC-IGBT 1 shown in FIG. 1. It is recognised from this figure that a thyristor structure, comprising a PNP transistor 1 and a NPN transistor 2, is parallel to an additional collector resistor 3. During reverse conduction, the current flows through both the thyristor structure (PNP transistor 1 and NPN transistor 2) and the PNP transistor 1 and the collector resistor 3. When the junction between the P-base region 11 and the N-drift region 10 (FIG. 1) is forward biased, the holes start flowing through the wide-base PNP transistor 1 and reach the P⁻ layer 3. Initially most of holes go downwards to the P⁺ layer 2 (FIG. 1) (through the collector resistor 3) and few of them become the base current of the narrow-base NPN transistor 2. When the base current is large enough, the NPN transistor 2 is activated and electrons start flowing into the N-drift region 10 and become the base current of the PNP transistor 1. Consequently, a positive feedback is formed between the PNP 1 and NPN 2 transistors, i.e. the embedded anti-parallel thyristor is turned on. The thyristor is also active when the P⁻ layer 3 gets depleted and therefore the NPN transistor 2 is in a punch-through mode. Reverse conduction in the off-state improves when the thyristor is more active by (i) having the P⁻ layer 3 smaller or the distance Dp smaller, (ii) by having lower doping concentration in the P⁻ layer 3, and (iii) by having higher area density of the N⁺ column region 4, shown in FIG. 1.

Figure 3:
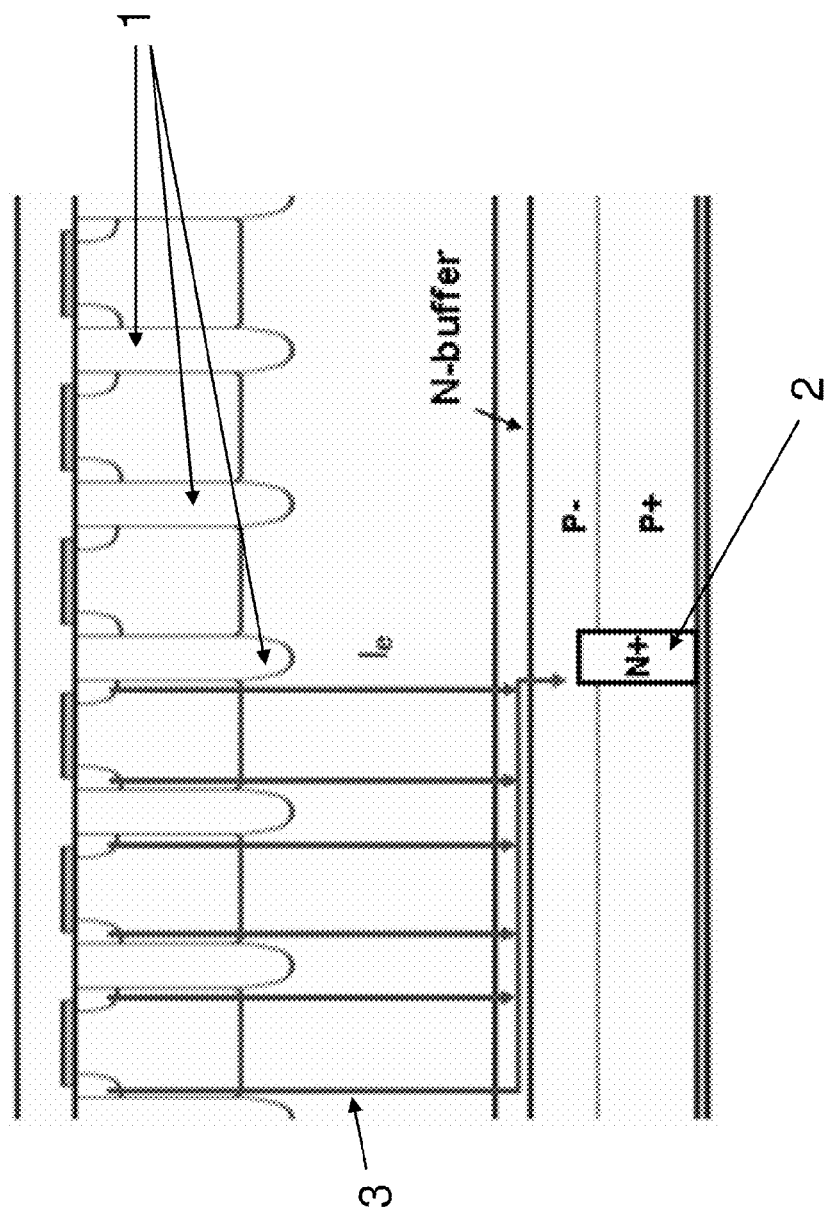
FIG. 3 is a schematic cross-section of a RC-IGBT having a plurality of gate regions according to the present invention.

As previously mentioned, conventional RC-IGBTs have snapback problems in the IGBT on-state. In the present invention, the problem can be solved by adjusting the channel density of the device. One way of controlling the channel density is to have multiple MOSFETs or gate regions. FIG. 3 is an embodiment of the present invention in which the RC-IGBT cross-section has a plurality of gate regions 1 comprising trench cells and only one N⁺ column region 2. The arrows 3 shown in the figure indicate the direction of current flow from the gate region 1. The presence of the plurality of gate regions 1 controls the channel density to eliminate the snapback problem in the IGBT on-state. As mentioned before, in the off-state, reverse conduction can be controlled by changing the density of the N⁺ column region 2. The layout style of the N⁺ column can be in stripes, segments, dots (including round, square, rectangular) or any other shapes.

Figure 4:
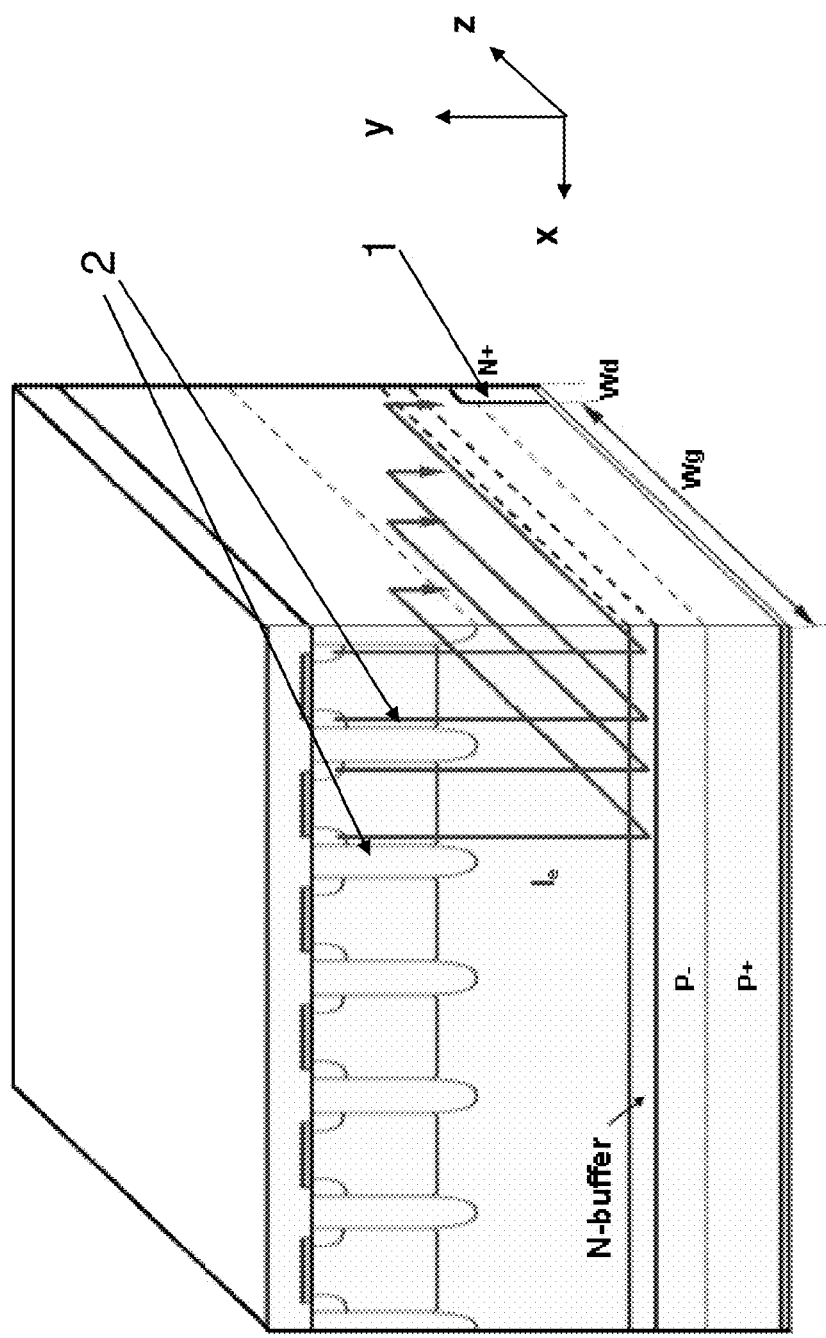
FIG. 4 is a schematic cross-section of a RC-IGBT shown in a three dimensional plane according to the present invention.

FIG. 4 is an embodiment of the present invention in which the RC-IGBT cross-section is shown in a three dimensional plane. It is not necessary that the placement of the N⁺ column region 1 is in the same plane as the trench cells 2. As shown the N⁺ column region 1 can be placed in the z-plane, so that the N⁺ column region 1 is perpendicular to the trench cells 2.

The IGBT structures shown in FIGS. 1 to 4 are based on a punch-through IGBT (PT-IGBT). However the present invention is equally applicable to other IGBT structures, e.g non-punch-through (NPT) IGBT, soft-punch-through (SPT) IGBT, diffused metal oxide semiconductor (DMOS) IGBT, U-shaped metal oxide semiconductor (UMOS) IGBT or the IGBTs with thin-wafer technology.

Figure 5:
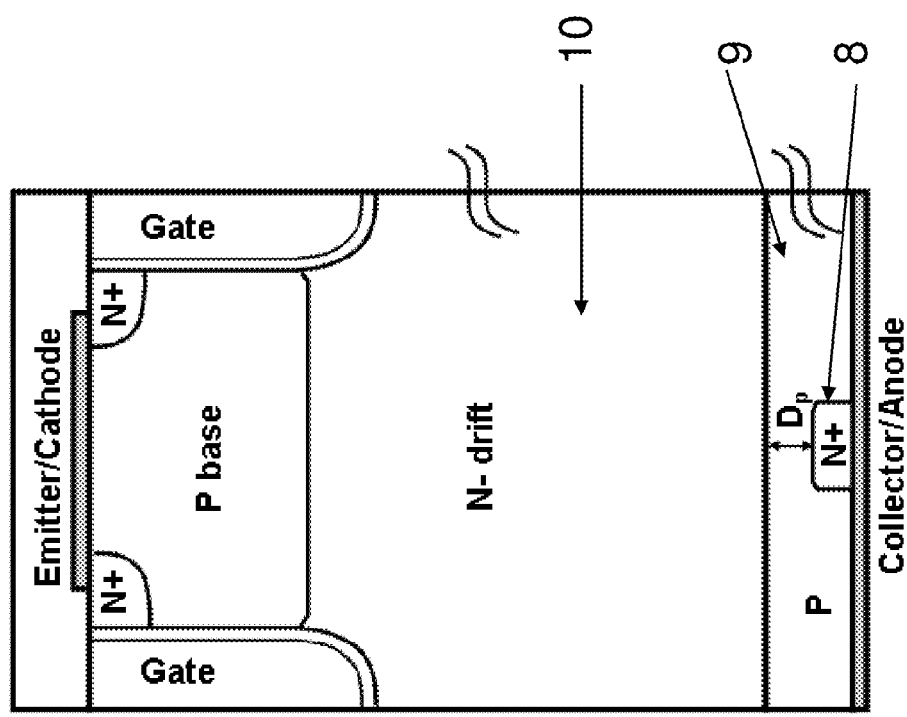
FIG. 5 is a schematic cross-section of a non-punch-through (NPT) RC-IGBT structure according to the present invention.

FIG. 5 is a schematic cross-section of a NPT RC-IGBT according to the present invention. Many features of this structure are similar to those of FIG. 1, but without the N-buffer layer 9 of FIG. 1. Typically the length of the N-drift region 10 of the NPT structures is more than that of a PT IGBT structure shown in FIG. 1. In the on-state, the snapback issue for the NPT structure can be eliminated by controlling the channel density (as described above for the PT IGBT with reference to FIGS. 3 and 4) and by adjusting the current gain of the narrow base NPN transistor formed by the N-drift region 10, P layer 9 and N+ column region 8 (FIG. 5).

Figure 6:
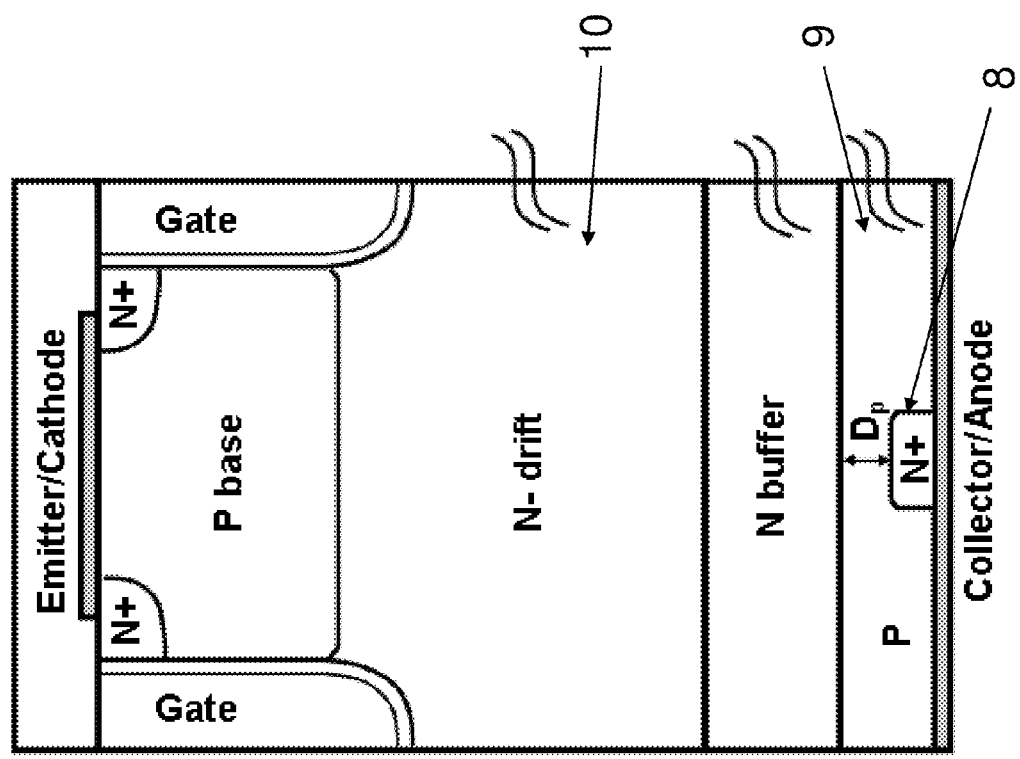
FIG. 6 is a schematic cross-section of a soft-punch-through (SPT) RC-IGBT structure according to the present invention.

FIG. 6 is a schematic cross-section of a SPT RC-IGBT according to the present invention. Most of the features of this structure are the same to those of FIG. 1. However the length of the N-drift region 10 of the SPT RC-IGBT is normally shorter than that of the PT RC-IGBT shown in FIG. 1. For both the NPT and SPT IGBT structures, the backside P-region 9 is very thin and the N+ column region 8 can formed by an ion implantation technique, rather than the epitaxy growth technique used in the PT IGBT structure shown in FIG. 1.

FIGS. 7a to 7h show the manufacturing steps S1 to S7 of the RC-IGBT, particularly the manufacturing steps of the column region, the P+ layer and the Player on a P-type substrate, according to the present invention.

S1: Implanting a first N+ column portion 2 into a P-type substrate 1 shown in FIGS. 7a and 7b. The implantation can be undertaken by multiple implantation steps in an energy range from 30 KeV to 1.5 MeV and a dosage range from $10^{14}$ to $10^{16}$ cm$^{-2}$.

S2: Performing thermal diffusion at a temperature range from 900° C. to 1200° C. for growing a first P-type epitaxy 1 shown in FIG. 7c in a concentration range from $1\times10^{16}$ to $5\times10^{19}$ cm$^{-3}$ and in a thickness range from 2 μm to 10 μm. Implanting a second column portion 3 into the P-type epitaxy 1 shown in FIG. 7c. The multiple implantation steps are undertaken in the same energy and dosage ranges as are mentioned in S1.

S3: Performing thermal diffusion at a temperature range from 900° C. to 1200° C. for growing a second P-type epitaxy 1 shown in FIG. 7d in a concentration range from $1\times10^{16}$ cm$^{-3}$ to $5\times10^{19}$ cm$^{-3}$ and in a thickness range from 2 μm to 10 μm. Implanting a third N+ column portion 3 into the P-type epitaxy 1 shown in FIG. 7d. The multiple implantation steps are undertaken in the same energy and dosage ranges as are mentioned in S1 and S2.

S4: Performing thermal diffusion at a temperature range from 900° C. to 1200° C. for growing a third P-type epitaxy 1 shown in FIG. 7e in a concentration range from $1\times10^{16}$ CM$^{-3}$ to $5\times10^{19}$ cm$^{-3}$ and in a thickness range from 2 μm to 10 μm. Implanting a fourth N+ column region 5 into the P-type epitaxy 1 shown in FIG. 7e. The multiple implantation steps are undertaken in the same energy and dosage ranges as are mentioned in S1 to S3.

S5: Performing thermal diffusion at a temperature range from 900° C. to 1200° C. for growing a lowly doped P-epitaxy 2 on the P-type epitaxy 1 shown in FIG. 7f. The lowly doped P-epitaxy 2 has a concentration range from $1\times10^{14}$ cm$^{-3}$ to $1\times10^{18}$ cm$^{-3}$ and a thickness range from 2 μm to 20 μm.

Figure 7A:
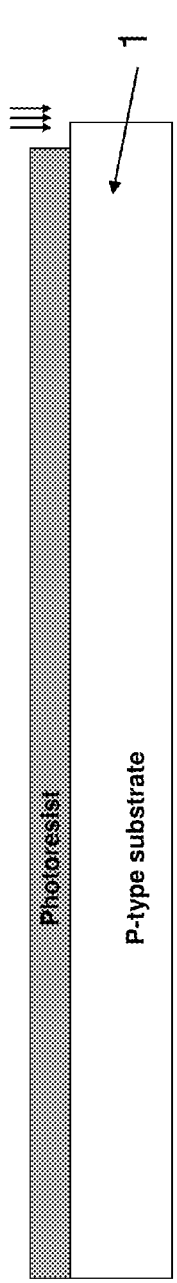
Figure 7B:
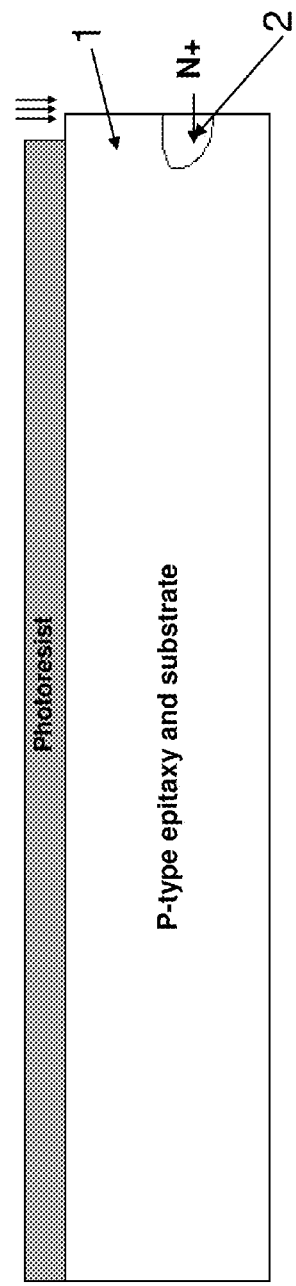
Figure 7C:
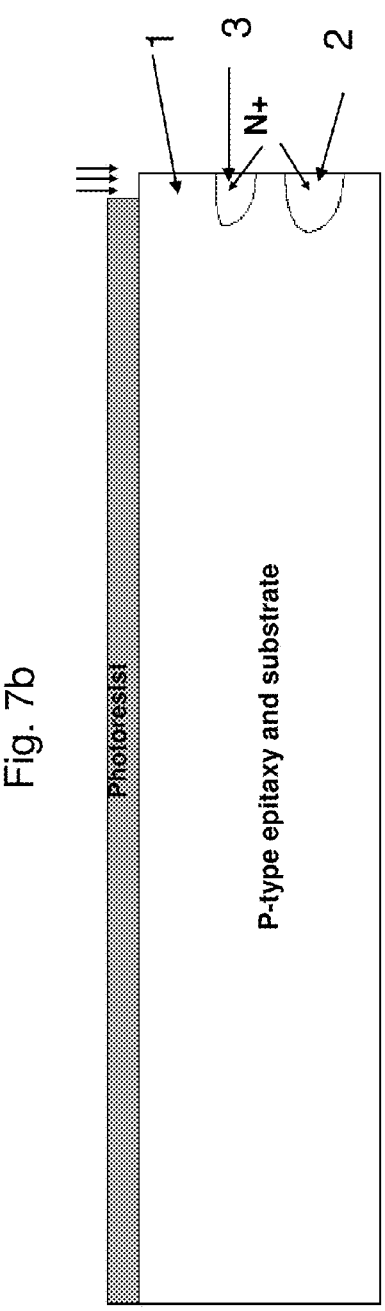
Figure 7H:
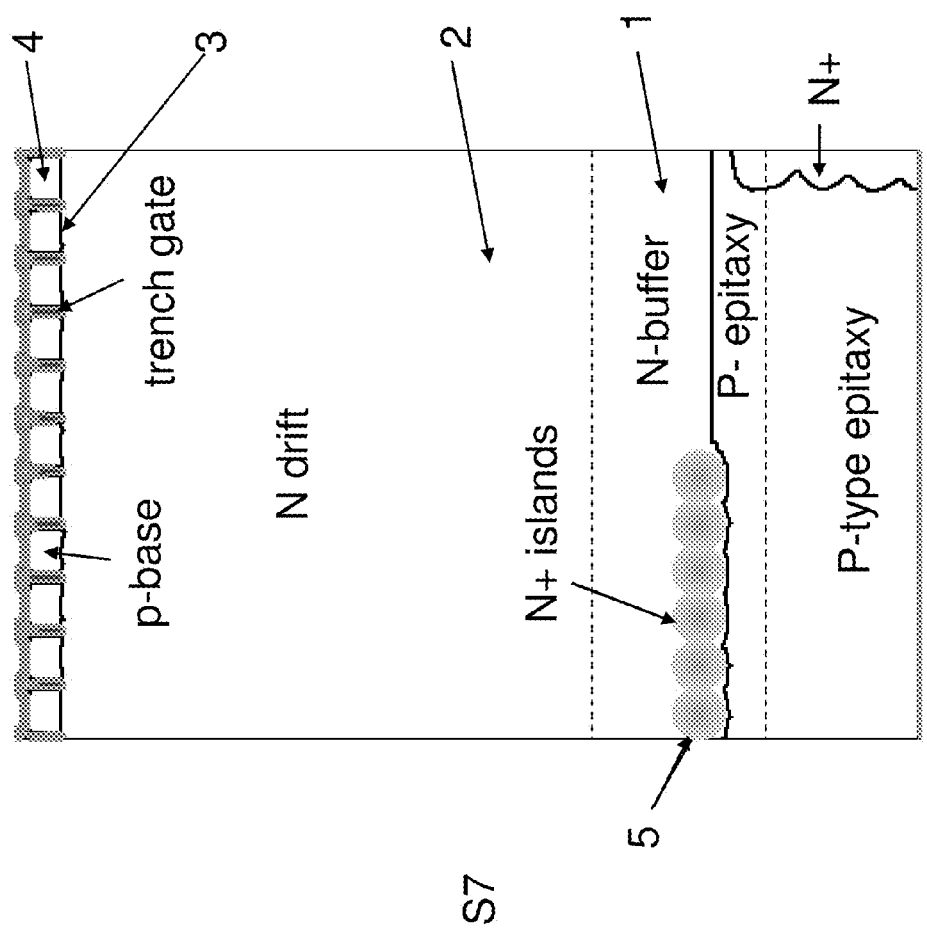

S6: Implanting N+ islands (shown by arrows 4) into the P-type region 2 shown in FIG. 7g. The implantation steps are undertaken in an energy range from 20 KeV to 100 KeV and a dosage range from $1\times10^{14}$ to $1\times10^{16}$ cm$^{-2}$. The implanted N+ islands 5 are shown in FIG. 7h.

S7: Growing N-buffer layer 1 and other top structures of the IGBT, e.g. N-drift region 2, trench gate 3 and P-base region 4 (shown in FIG. 7h) based on the standard manufacturing process on the basis of the different requirements of the IGBT.

The skilled person will understand that, in the preceding description and appended claims, positional terms such as 'above', 'top', 'on', etc. are made with reference to conceptual illustrations of a transistor, such as those showing standard cross-sectional perspectives and those shown in the appended drawings. These terms are used for ease of reference but are not intended to be of a limiting nature. These terms are therefore to be understood as referring to a transistor when in an orientation as shown in the accompanying drawings.

It will be appreciated that all doping polarities mentioned above could be reversed, the resulting devices still being in accordance with the present invention. It will be appreciated that the gate, emitter/cathode and collector/anode electrodes could be arranged to be out-of-plane or to be differently aligned so that the direction of the carriers is not exactly as described above, the resulting devices still being in accordance with the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. An insulated gate bipolar transistor (IGBT) comprising a semiconductor substrate having the following regions in sequence:
   (i) a first region of a first conductive type having opposing surfaces, a column region of a second conductive type within the first region extending from a first of said opposing surfaces;
   (ii) a drift region of the second conductive type;
   (iii) a second region of the first conductive type; and
   (iv) a third region of the second conductive type;
   wherein a gate electrode is disposed to form a current channel between the third region and the drift region, a first electrode is operatively connected to the second region and the third region, and a second electrode is operatively connected to the first region and the column region,
   wherein the column region is spaced from a second of said opposing surfaces, whereby a forward conduction path extends through the third region, the second region, the drift region, and the first region, and whereby a reverse conduction path extends through the second region, the drift region, the first region and the column region
   wherein the first region comprises first and second layers, the second layer having a lower doping concentration than the first layer, and
   wherein reverse conduction occurs through an anti-parallel thyristor structure comprising a first bipolar junction transistor (BJT) formed by the second layer of the first region, the drift region, the second region, and a second bipolar junction transistor (BJT) formed by the column region, the second layer of the first region and the drift region.

2. The IGBT of claim 1, wherein the column region is spaced from the drift region.

3. The IGBT of claim 1, wherein the thyristor structure is arranged to be triggered, when reverse conduction occurs, by one or both of the following:
   the total current gain of the first BJT and the second BJT approaches to unity; and
   the drift region or the second layer of the first region is substantially depleted and one of the two BJTs is in a punch-through mode.

4. The IGBT of claim 1, wherein the height of the first layer of the first region is about the same as that of the column region.

5. The IGBT of claim 1, wherein the doping concentration of the second layer of the first region is in a range from 1014 cm-3 to 1018 cm-3.

6. The IGBT of claim 1, wherein the column region is spaced from the second surface by a distance between 0.2 μm and 10 μm.

7. The IGBT of claim 1, wherein the column region is dimensioned and/or positioned to substantially increase the area density of the column region so as to improve reverse conduction in an off-state.

8. The IGBT of claim 1, which is selected from the group comprising:
   a punch-through (PT) IGBT in which a buffer region is formed between the first region and the drift region;
   a soft-punch-through (SPT) IGBT in which a buffer region is formed between the first region and the drift region;
   a non-punch-through (NPT) IGBT;
   a diffused metal oxide semiconductor (DMOS) IGBT; and
   a U-shaped metal oxide semiconductor (UMOS) IGBT.

9. The IGBT of claim 8, wherein the buffer region is dimensioned to control the resistance of the buffer region so as to improve the snapback performance in an on-state.

10. The IGBT of claim 1, wherein a plurality of gate electrodes is provided to control the density of the channel so as to improve the snapback performance in an on-state.

11. The IGBT of claim 1, wherein the current gain of the second transistor is controlled so as to improve the snapback performance in an on-state.

12. The IGBT of claim 1, wherein the column region comprises a layout selected from the group comprising stripes, segments and dots including round, square and rectangular.

13. The IGBT of claim 1, wherein the gate electrode is selected from the group comprising a planar gate electrode and a trench gate electrode.

14. The IGBT of claim 1, wherein the first conductive type is the p-conductivity type and the second conductive type is the n-conductivity type.

15. A method of manufacturing an insulated gate bipolar transistor comprising a semiconductor substrate having the following regions in sequence:
   (i) a first region of a first conductive type having opposing surfaces, a column region of a second conductive type within the first region extending from a first of said opposing surfaces;
   (ii) a drift region of the second conductive type;
   (iii) a second region of the first conductive type; and
   (iv) a third region of the second conductive type;
   wherein a gate electrode is disposed to form a current channel between the third region and the drift region, a first electrode is operatively connected to the second region and the third region, and a second electrode is operatively connected to the first region and the column region,
   the method comprising:
   spacing the column region from a second of said opposing surfaces, whereby a forward conduction path extends through the third region, the second region, the drift region and the first region, whereby a reverse conduction path extends through the second region, the drift region, the first region and the column region,
   wherein the first region comprises first and second layers, the second layer having a lower doping concentration than the first layer, and
   wherein reverse conduction occurs through an anti-parallel thyristor structure comprising a first bipolar junction transistor (BJT) formed by the second layer of the first region, the drift region, the second region, and a second bipolar junction transistor (BJT) formed by the column region, the second layer of the first region and the drift region.

16. The method of claim 15, wherein the column region is formed using an ion implantation technique.

17. The method of claim 16, wherein the ion implantation technique comprises a plurality of implantation steps, which are carried out in an energy range from 30 KeV to 1.5 MeV and a dosage range from $10^{14}$ cm$^{-2}$ to $10^{18}$ cm$^{-2}$.

18. The method of claim 15, wherein the substrate is formed using an epitaxial technique.

* * * * *